| (12) | United States Patent | (10) Patent No.: US 10,734,164 B2 |
|---|---|---|
| | Saito | (45) Date of Patent: Aug. 4, 2020 |

(54) CAPACITOR AND METHOD FOR MANUFACTURING CAPACITOR

(71) Applicant: Murata Manufacturing Co., Ltd., Nagaokakyo-shi, Kyoto-fu (JP)

(72) Inventor: Yoshifumi Saito, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/802,507

(22) Filed: Nov. 3, 2017

(65) Prior Publication Data

US 2018/0137990 A1 May 17, 2018

(30) Foreign Application Priority Data

Nov. 15, 2016 (JP) .................. 2016-222640

(51) Int. Cl.
| H01G 9/15 | (2006.01) |
| H01G 4/252 | (2006.01) |
| H01G 9/00 | (2006.01) |
| H01L 21/02 | (2006.01) |
| H01G 9/07 | (2006.01) |
| H01L 49/02 | (2006.01) |
| H01G 9/04 | (2006.01) |
| H01G 4/005 | (2006.01) |
| H01G 4/08 | (2006.01) |
| H01G 4/248 | (2006.01) |

(52) U.S. Cl.
CPC .............. *H01G 9/15* (2013.01); *H01G 4/005* (2013.01); *H01G 4/252* (2013.01); *H01G 9/0032* (2013.01); *H01G 9/04* (2013.01); *H01G 9/07* (2013.01); *H01L 21/02186* (2013.01); *H01L 28/60* (2013.01); *H01G 4/085* (2013.01); *H01G 4/248* (2013.01)

(58) Field of Classification Search
CPC .......... H01G 9/15; H01G 4/085; H01G 4/252; H01G 9/0032; H01G 9/04; H01G 9/07; H01G 4/248; H01G 4/008; H01G 4/012; H01G 4/33; H01L 21/02186; H01L 28/60; H01L 28/82
USPC ........................................................ 361/305
See application file for complete search history.

(56) References Cited

U.S. PATENT DOCUMENTS

| 7,006,348 B1 | 2/2006 | Ueda et al. |
| 9,390,863 B2 | 7/2016 | Chien et al. |

(Continued)

FOREIGN PATENT DOCUMENTS

| TW | 200611288 A | 4/2006 |
| TW | 201526047 A | 7/2015 |
| WO | WO 2015/118901 A1 | 8/2015 |

*Primary Examiner* — Michael P McFadden
(74) *Attorney, Agent, or Firm* — Arent Fox LLP

(57) ABSTRACT

A capacitor that includes a conductive metal substrate having a high porosity portion and a low porosity portion with a porosity lower than that of the high porosity portion; a dielectric layer on the conductive metal substrate; an upper electrode on the dielectric layer; an upper extended electrode on one principal face of the conductive metal substrate and electrically connected to the upper electrode; a lower extended electrode on the other principal face of the conductive metal substrate and electrically connected to the conductive metal substrate; and insulating layer on the upper electrode at a position overlapping with the low porosity portion through the dielectric layer and the upper electrode.

13 Claims, 13 Drawing Sheets

(56) References Cited

U.S. PATENT DOCUMENTS

| | | |
|---|---|---|
| 2006/0061940 A1 | 3/2006 | Ueda et al. |
| 2009/0122460 A1* | 5/2009 | Gschwandtner ....... H01G 4/008 |
| | | 361/305 |
| 2011/0193194 A1* | 8/2011 | Takahashi ............... H01L 28/75 |
| | | 257/532 |
| 2013/0233605 A1* | 9/2013 | Hsu ........................ H01G 9/012 |
| | | 174/260 |
| 2015/0187496 A1 | 7/2015 | Chien et al. |
| 2016/0329158 A1 | 11/2016 | Hattori et al. |

* cited by examiner

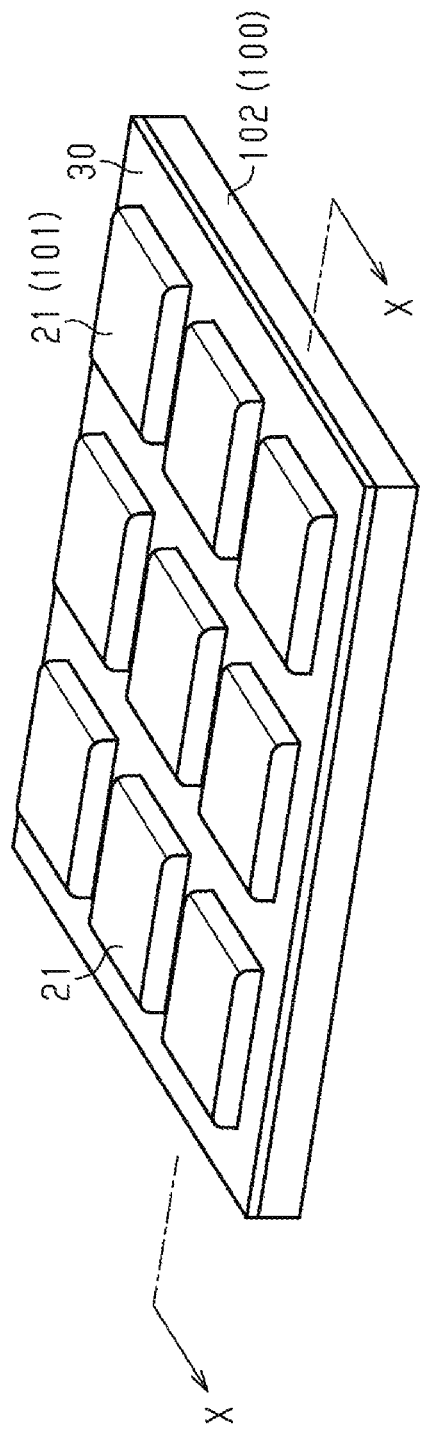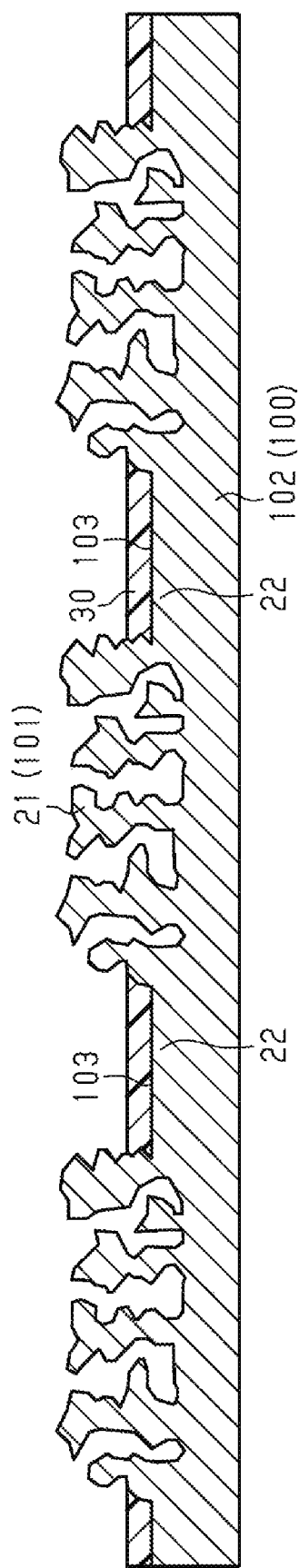
FIG. 4A
FIG. 4B

CAPACITOR AND METHOD FOR MANUFACTURING CAPACITOR

CROSS REFERENCE TO RELATED APPLICATIONS

The present application claims priority to Japanese Patent Application No. 2016-222640, filed Nov. 15, 2016, the entire contents of which are incorporated herein by reference.

BACKGROUND OF THE INVENTION

Field of the Invention

The present invention relates to a capacitor and a method for manufacturing a capacitor.

Description of the Related Art

Conventionally, there is known a capacitor that uses a conductive metal substrate with a porous structure to obtain a large capacitance (e.g., refer to International Publication No. WO 2015/118901).

The capacitor of International Publication No. WO 2015/118901 includes a conductive metal substrate, a dielectric layer formed on the conductive metal substrate, an upper electrode formed on the dielectric layer, a first terminal electrode electrically connected to the conductive metal substrate, and a second terminal electrode electrically connected to the upper electrode.

The conductive metal substrate includes a high porosity portion with a relatively high porosity, and a low porosity portion with a porosity lower than that of the high porosity portion, the low porosity portion being positioned around the high porosity portion. The conductive metal substrate can be obtained by a method in which a porous layer is preliminarily formed by applying etching treatment to a porous metal foil, and in which the formed porous layer is partly partitioned by using a press, a laser, or the like to form a high porosity portion and a low porosity portion, for example. In this kind of method, the high porosity portion is configured to protrude relative to the low porosity portion. This allows a central portion of the capacitor to protrude from a peripheral portion (end portion) thereof.

In the capacitor as described above, the central portion of the capacitor is configured to protrude from the peripheral portion (end portion) thereof. In other words, the peripheral portion is depressed relative to the central portion. In the capacitor as described above, improvement in flatness of a principal face of the capacitor is desired.

The present invention is made to solve the above problem, and an object thereof is to provide a capacitor and a method for manufacturing a capacitor capable of improving flatness of its principal face.

SUMMARY OF THE INVENTION

An embodiment of a capacitor to solve the problem above includes a conductive metal substrate having a first porosity portion with a porous structure and a second porosity portion with a porosity lower than that of the first porosity portion, the first porosity portion protruding from the second porosity portion, and the first porosity portion and the second porosity portion defining a first principal face of the conductive metal substrate; a dielectric layer on the conductive metal substrate; an upper electrode on the dielectric layer; a first terminal electrode on the first principal face of the conductive metal substrate and electrically connected to the upper electrode; a second terminal electrode on a second principal face of the conductive metal substrate and electrically connected to the conductive metal substrate; and at least a first insulating layer on the upper electrode at a position overlapping with the second porosity portion through the dielectric layer and the upper electrode.

According to this structure, at least the first insulating layer is provided on a relatively low peripheral edge of the capacitor (on a second porosity portion side), so that a recess in the peripheral edge of the capacitor can be eliminated. This enables improvement in flatness of the principal face.

In the capacitor described above, it is preferable that the first terminal electrode is provided on the upper electrode at a position overlapping with the first porosity portion through the dielectric layer and the upper electrode, and that the first insulating layer is provided at a position overlapping with the second porosity portion through the dielectric layer and the upper electrode, while surrounding a periphery of the first terminal electrode.

According to this structure, the first insulating layer is provided at a position overlapping with the second porosity portion through the dielectric layer and the upper electrode, while surrounding the periphery of the first terminal electrode positioned on a central side of the capacitor. This forms a structure in which the first terminal electrode is not exposed to a side face of the capacitor (a side face facing in a direction orthogonal to the principal face), so that a short circuit between the first terminal electrode and the second terminal electrode can be prevented.

In the capacitor described above, it is preferable that a third terminal electrode is provided on the principal face of the conductive metal substrate, the principal face including the first terminal electrode, while being insulated from the first terminal electrode, and is electrically connected to the conductive metal substrate.

According to this structure, the first terminal electrode and the third terminal electrode are provided on the one principal face, and the second terminal electrode is provided on the other principal face. In other words, placement of the terminal electrodes on the substrate allows a case where the first terminal electrode and the second terminal electrode are used, and a case where the first terminal electrode and the third terminal electrode are used, to be properly selected, and thus can contribute to improvement in convenience.

In the capacitor described above, it is preferable to provide a second insulating layer in an end portion of the capacitor at any position between the conductive metal substrate and the upper electrode.

According to this structure, the second insulating layer is provided at any position between the conductive metal substrate and the upper electrode, so that a short circuit between the conductive metal substrate and the upper electrode can be prevented.

In the capacitor described above, it is preferable to provide a third insulating layer surrounding a periphery of the second terminal electrode on the other principal face of the conductive metal substrate.

According to this configuration, the third insulating layer surrounding the second terminal electrode is provided on the other principal face of the conductive metal substrate. This forms a structure in which the second terminal electrode is not exposed to the side face of the capacitor (the side face facing in the direction orthogonal to the principal face), so that a short circuit between the first terminal electrode and the second terminal electrode can be prevented.

In the capacitor described above, it is preferable to provide a fourth insulating layer covering a surface of the second terminal electrode on the other principal face of the conductive metal substrate.

According to this structure, the fourth insulating layer covering the surface of the second terminal electrode is provided on the other principal face of the conductive metal substrate, so that capacitance can be acquired between the first terminal electrode and the third terminal electrode.

A further embodiment of a capacitor to solve the problem above includes a conductive metal substrate having a first porosity portion with a porous structure and a second porosity portion with a porosity lower than that of the first porosity portion, the first porosity portion protruding from the second porosity portion, and the first porosity portion and the second porosity portion defining a first principal face of the conductive metal substrate; a dielectric layer on the conductive metal substrate; an upper electrode on the dielectric layer; a first upper terminal electrode on the upper electrode and overlapping with the first porosity portion through the dielectric layer and the upper electrode and electrically connected to the upper electrode; a second upper terminal electrode on the principal face of the conductive metal substrate, the principal face including the first upper terminal electrode, and electrically connected to the conductive metal substrate while being insulated from the first upper terminal electrode; and at least a first insulating layer on the upper electrode at a position overlapping with the second porosity portion through the dielectric layer and the upper electrode.

According to this structure, the capacitor including the two electrodes (the first upper terminal electrode and the second upper terminal electrode) on the one principal face of the conductive metal substrate is provided in its relatively low peripheral edge (on a second porosity portion side) with the first insulating layer. This enables a recess in the peripheral edge of the capacitor to be eliminated. This enables improvement in flatness of the principal face.

An embodiment of a method for manufacturing a capacitor to solve the problem above includes forming a dielectric layer on a conductive metal substrate having a first porosity portion with a porous structure and a second porosity portion with a porosity lower than that of the first porosity portion, the first porosity portion and the second porosity portion defining a first principal face of the conductive metal substrate; forming an upper electrode on the dielectric layer; forming at least a first insulating layer on the upper electrode at a position overlapping with the second porosity portion through the dielectric layer and the upper electrode; forming a first terminal electrode that is electrically connected to the upper electrode; and forming a second terminal electrode that is electrically connected to the conductive metal substrate.

According to this structure, at least the first insulating layer is provided on a relatively low peripheral edge of the capacitor (on a second porosity portion side), so that a recess in the peripheral edge of the capacitor can be eliminated. This enables improvement in flatness of the principal face.

A further embodiment of a method for manufacturing a capacitor to solve the problem above includes forming a dielectric layer on a conductive metal substrate having a first porosity portion with a porous structure and a second porosity portion with a porosity lower than that of the first porosity portion, the first porosity portion and the second porosity portion defining a first principal face of the conductive metal substrate; forming an upper electrode on the dielectric layer; forming at least a first insulating layer on the upper electrode at a position overlapping with the second porosity portion through the dielectric layer and the upper electrode; forming a first upper terminal electrode that is electrically connected to the upper electrode; and forming a second upper terminal electrode on the first principal face of the conductive metal substrate and that is electrically connected to the conductive metal substrate while being insulated from the first upper terminal electrode.

According to this structure, the capacitor including the two electrodes (the first upper terminal electrode and the second upper terminal electrode) on the one principal face of the conductive metal substrate is provided in its relatively low peripheral edge (on a second porosity portion side) with the first insulating layer. This enables a recess in the peripheral edge of the capacitor to be eliminated. This enables improvement in flatness of the principal face.

In the above methods for manufacturing a capacitor, it is preferable that the dielectric layer is formed by an atomic layer deposition method.

According to this configuration, the dielectric layer is formed by the atomic layer deposition method, so that the dielectric layer can be made uniform in thickness.

In the above methods for manufacturing a capacitor, it is preferable that the upper electrode is formed by an atomic layer deposition method.

According to this structure, the upper electrode is formed by the atomic layer deposition method, so that a layer (film) of the upper electrode can be made uniform in thickness.

The capacitors and the methods for manufacturing capacitors according to embodiments of the present invention achieve an effect of enabling improvement in flatness of a principal face thereof.

BRIEF DESCRIPTION OF THE DRAWINGS

FIGS. 4A-4B are an illustration for describing a method for manufacturing a capacitor, FIG. 4A being a perspective view of a collective substrate, and FIG. 4B being a schematic sectional view taken along line X-X of FIG. 4A;

DETAILED DESCRIPTION OF THE INVENTION

Hereinafter, a capacitor and a method for manufacturing a capacitor of each embodiment will be described with reference to the accompanying drawings. In the accompanying drawings, a component may be illustrated in an enlarged manner for easy understanding. A ratio of size of a component may be different from an actual ratio thereof, or from that in another drawing. In the sectional views, some components may be shown by substituting a satin pattern for hatching for easy understanding.

Figure 1:
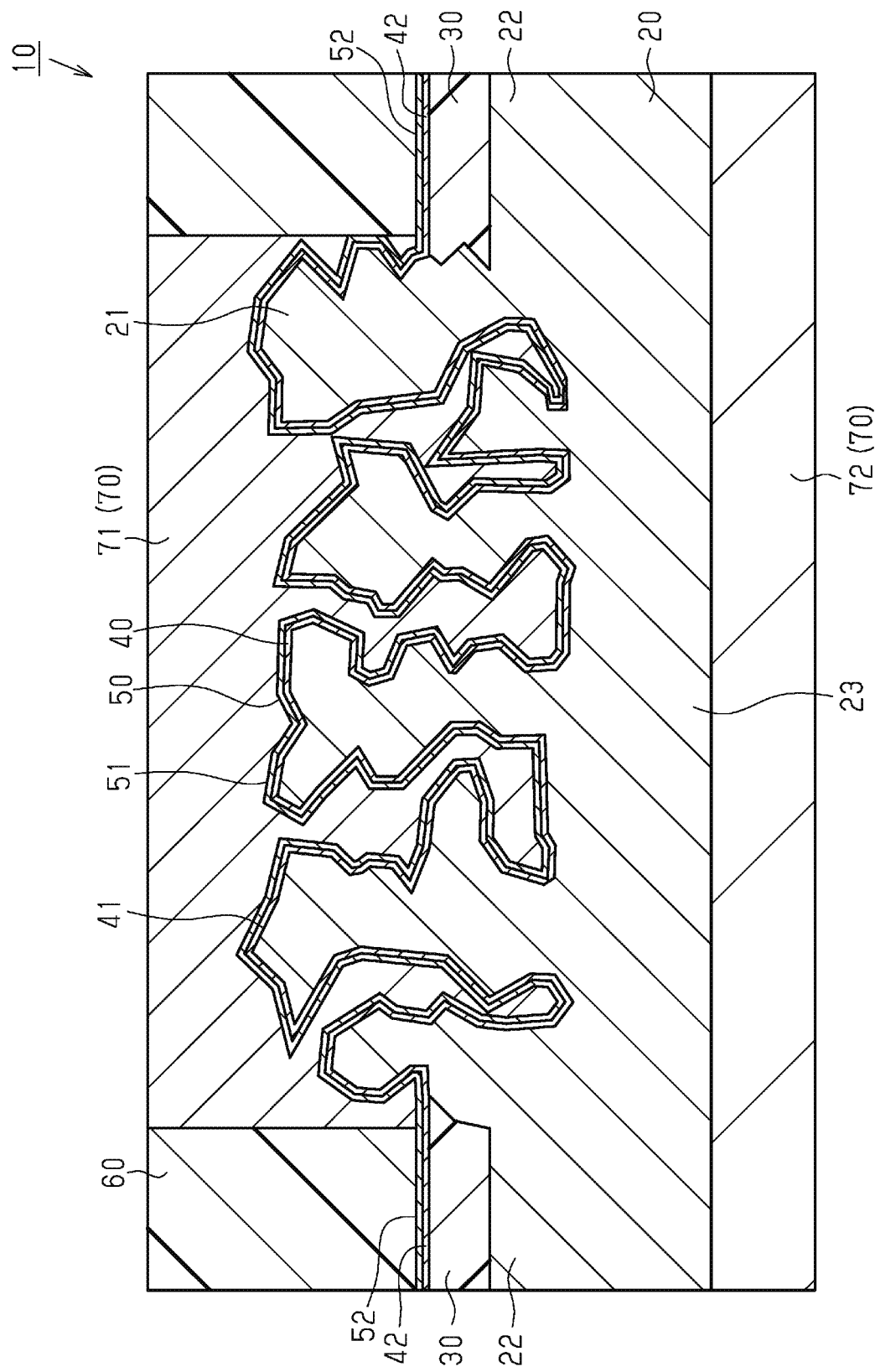
FIG. 1 is a sectional view of a capacitor in a first embodiment.

As illustrated in FIG. 1, a capacitor 10 includes a conductive metal substrate 20, an insulating layer 30, a dielectric layer 40, an upper electrode 50, an insulating layer 60, and an extended electrode 70. The capacitor 10 of the present embodiment is formed in a substantially rectangular parallelepiped shape. The "substantially rectangular parallelepiped shape" includes a rectangular parallelepiped with chamfered corners and ridges, and a rectangular parallelepiped with rounded corners and ridges.

As illustrated in FIG. 1, the conductive metal substrate 20 is provided in its one principal face with a high porosity portion 21 as a first porosity portion with a relatively high porosity and a low porosity portion 22 as a second porosity portion with a relatively low porosity, and is provided in its other principal face with a support portion 23. That is, the high porosity portion 21 and the low porosity portion 22 constitute a first surface of the conductive metal substrate 20, and the support portion 23 constitutes a second surface of the conductive metal substrate 20. The first surface is the one principal face, and the second surface is the other principal face. The second surface is opposite to the first surface. In FIG. 1, the first surface is an upper face of the conductive metal substrate 20, and the second surface is a lower face of the conductive metal substrate 20.

While material constituting the conductive metal substrate 20 is not particularly limited as long as it is a metal, the material includes aluminum, tantalum, nickel, copper, titanium, niobium, and iron, and alloys such as stainless steel and duralumin. Preferably, the material constituting the conductive metal substrate 20 is aluminum.

The term "porosity" as used in the present embodiment refers to a ratio of voids occupied in the conductive metal substrate 20. The porosity can be measured as follows. While voids of each of the porosity portions 21 and 22 can be finally filled with the dielectric layer 40, the upper electrode 50, or the like in a process of manufacturing the capacitor 10, the above "porosity" is calculated by considering a filled portion as a void without reference to a substance filled therein as described above.

First, the conductive metal substrate 20 is processed into a thin piece with a thickness of 60 nm or less by a focused ion beam (FIB) processing. A predetermined area (3 μm by 3 μm) of the thin piece sample is photographed using a transmission electron microscope (TEM).

Image analysis of the obtained image is performed to determine an area of metal existing in the conductive metal substrate 20. Then, a porosity can be obtained from the following formula.

$$\text{Porosity} = ((\text{measurement area} - \text{area of metal existing in a substrate})/\text{measurement area}) \times 100$$

The periphery of the high porosity portion 21 constituting the conductive metal substrate 20 is surrounded by the low porosity portion 22. The high porosity portion 21 has a porous structure. The high porosity portion 21 has a porosity higher than that of the support portion 23 and the low porosity portion 22, constituting the conductive metal substrate 20. The high porosity portion 21 increases a specific surface area of the conductive metal substrate to increase capacitance of the capacitor 10.

From a viewpoint of increasing a specific surface area to further increase capacitance of the capacitor 10, the porosity of the high porosity portion 21 can be preferably 20% or more, more preferably 30% or more, and still more preferably 35% or more. In addition, from a viewpoint of securing mechanical strength, the porosity thereof is preferably 90% or less, and more preferably 80% or less.

While an enlargement ratio of area of the high porosity portion 21 is not particularly limited, the high porosity portion 21 has an enlargement ratio of area that is preferably 30 times or more and 10,000 times or less, more preferably 50 times or more and 5,000 times or less, and 300 times or more and 600 times or less, for example. Here, the enlargement ratio of area means a surface area per unit projected area. The surface area per unit projected area can be obtained from the amount of adsorption of nitrogen at the liquid nitrogen temperature using a BET specific surface area measuring apparatus.

The low porosity portion 22 has a porosity lower than that of the high porosity portion 21. Preferably, a porosity of the low porosity portion 22 is lower than a porosity of the high porosity portion 21, and is equal to or higher than a porosity of the support portion 23.

A porosity of the low porosity portion 22 is preferably 20% or less, and more preferably 10% or less. Further, the low porosity portion 22 may have a porosity of 0%. That is, the low porosity portion 22 may or may not have a porous structure. As the low porosity portion 22 decreases in porosity, the capacitor 10 increases in mechanical strength. The low porosity portion 22 may be eliminated. For example, in FIG. 1, the low porosity portion 22 may not exist, and the support portion 23 may be exposed upward. In this case, a portion exposed above of the support portion 23 corresponds to the second porosity portion.

The support portion 23 of the conductive metal substrate 20 preferably has a small porosity to serve as a support. Specifically a porosity of 10% or less is preferable, and substantially no void is more preferable.

The insulating layer 30 is provided so as to cover the low porosity portion 22. When the insulating layer 30 is provided, a short circuit between the upper electrode 50 and the conductive metal substrate 20 can be prevented.

While material forming the insulating layer 30 is not particularly limited as long as being insulative, resin with heat resistance is preferable when an atomic layer deposition method is used later. As an insulating material forming the insulating layer 30, various kinds of glass material, ceramic material, polyimide resin, and fluororesin, are preferable. In the present example, a polyimide resin is used for the insulating layer 30. The insulating layer 30 corresponds to the second insulating layer.

The dielectric layer 40 includes a first dielectric layer 41 covering the high porosity portion 21, and a second dielectric layer 42 covering the insulating layer 30. It is preferable that the first dielectric layer 41 and the second dielectric layer 42 are formed integrally with each other, and are formed in the same step (same timing) in a manufacturing process.

While a material forming the dielectric layer 40 is not particularly limited as long as being insulative, a metallic oxide such as AlOx (e.g., $Al_2O_3$), SiOx (e.g., $SiO_2$), AlTiOx, SiTiOx, HfOx, TaOx, ZrOx, HfSiOx, ZrSiOx, TiZrOx, TiZrWOx, TiOx, SrTiOx, PbTiOx, BaTiOx, BaSrTiOx, BaCaTiOx, and SiAlOx; a metallic nitride such as AlNx, SiNx, and AlScNx; and a metallic oxynitride such as AlOxNy, SiOxNy, HfSiOxNy, SiCxOyNz, are preferable, and AlOx, SiOx, SiOxNy, and HfSiOx are more preferable. The formula described above simply expresses structure of the material, and thus does not limit composition thereof. That is, x, y, and z attached to O and N may be any value greater than zero, and an abundance ratio of each element including a metal element is arbitrary.

The dielectric layer 40 is preferably formed by a gas phase method such as a vacuum deposition method, a chemical vapor deposition (CVD) method, a sputtering method, an atomic layer deposition (ALD) method, a pulsed laser deposition (PLD) method, or the like. The ALD method is more preferable because a more uniform layer (film) can be formed in a fine pore of a porous member.

The upper electrode 50 is formed on the dielectric layer 40. More specifically, the upper electrode 50 includes a first upper electrode 51 provided on the first dielectric layer 41, and a second upper electrode 52 provided on the second dielectric layer 42. It is preferable that the first upper electrode 51 and the second upper electrode 52 are formed integrally with each other, and are formed in the same step (same timing) in a manufacturing process.

While material constituting the upper electrode 50 is not particularly limited as long as being conductive, Ni, Cu, Al, W, Ti, Ag, Au, Pt, Zn, Sn, Pb, Fe, Cr, Mo, Ru, Pd, and Ta; and alloys thereof such as CuNi, AuNi, AuSn; metallic oxides and metallic oxynitrides such as TiN, TiAlN, TiON, TiAlON and TaN; a conductive polymer such as poly-3,4-ethylenedioxythiophene (PEDOT), polypyrrole, and polyaniline; and the like, are preferable, and TiN and TiON are more preferable.

The upper electrode 50 may be formed by an ALD method. When the ALD method is used, capacitance of the capacitor can be made larger. Alternatively, the upper electrode may be formed by a method such as a chemical vapor deposition (CVD) method, a plating, a bias sputtering, a Sol-Gel method, and filling with an electroconductive polymer, which can cover the dielectric layer and can substantially fill the pores of conductive metal substrate. Preferably, the upper electrode may be formed as follows: a conductive film is formed on the dielectric layer by the ALD method; and pores are filled with a conductive substance, preferably a substance with a lower electrical resistance, from above the conductive film by another method. When this kind of structure is formed, a higher electrostatic capacitance density and a lower equivalent series resistance (ESR) can be efficiently obtained.

The insulating layer 60 is formed on the second upper electrode 52 in the upper electrode 50. While material forming the insulating layer 60 is not particularly limited as long as being an insulating material, an epoxy resin being a thermosetting resin can be used, for example. The insulating layer 60 corresponds to the first insulating layer.

The extended electrode 70 includes an upper extended electrode 71, and a lower extended electrode 72.

The upper extended electrode 71 is formed on the first upper electrode 51 of the upper electrode 50. That is, the upper extended electrode 71 is electrically connected to the upper electrode 50.

The lower extended electrode 72 is formed on the principal face of the conductive metal substrate 20, on a support portion 23 side. That is, the lower extended electrode 72 is electrically connected to the conductive metal substrate 20.

While material constituting the upper extended electrode 71 and the lower extended electrode 72 are not particularly limited, a metal such as Au, Pb, Ag, Sn, Ni, and Cu, and alloys thereof, and a conductive polymer, are preferable, for example.

In consideration of adhesion, solderability, solder solution, conductivity, wire bonding property, laser resistance, and the like, when material constituting the conductive metal substrate 20 is aluminum, it is preferable that material constituting the upper extended electrode 71 and the lower extended electrode 72 is Cu, Ti/Al, Ni/Au, Ti/Cu, Cu/Ni/Au, Ni/Sn, or Cu/Ni/Sn. Here, Ti/Al means that an Al coating is formed on a Ti coating after the Ti coating is formed, for example.

When material constituting the conductive metal substrate 20 is copper, Al, Ti/Al, or Ni/Cu is preferable as the material constituting the upper extended electrode 71 and the lower extended electrode 72. In addition, when material constituting the conductive metal substrate 20 is nickel, Al, Ti/Al, Cu, Au, or Sn is preferable as the material constituting the upper extended electrode 71 and the lower extended electrode 72.

Subsequently, a process for manufacturing (a method for manufacturing) the capacitor 10 configured as described above will be described. FIGS. 2A to 9A each schematically illustrate a perspective view of a collective substrate of a capacitor element body, and FIGS. 2B to 9B each schematically illustrate a sectional view taken along line X-X of the corresponding FIGS. 2A to 9A.

Figure 2A:
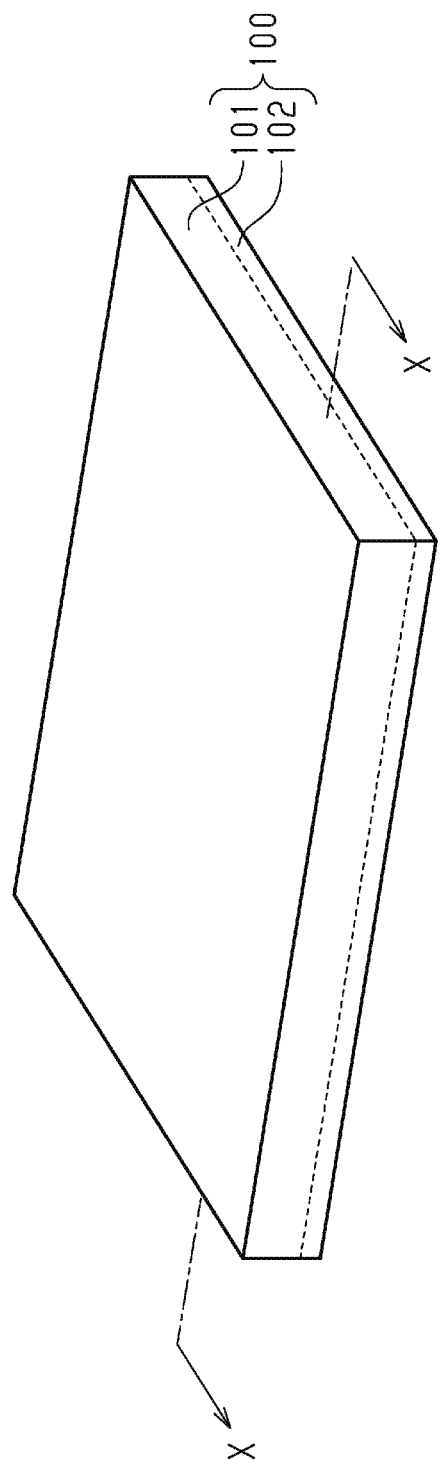
FIGS. 2A-2B are an illustration for describing a method for manufacturing a capacitor, FIG. 2A being a perspective view of a collective substrate, and FIG. 2B being a schematic sectional view taken along line X-X of FIG. 2A.
Figure 2B:
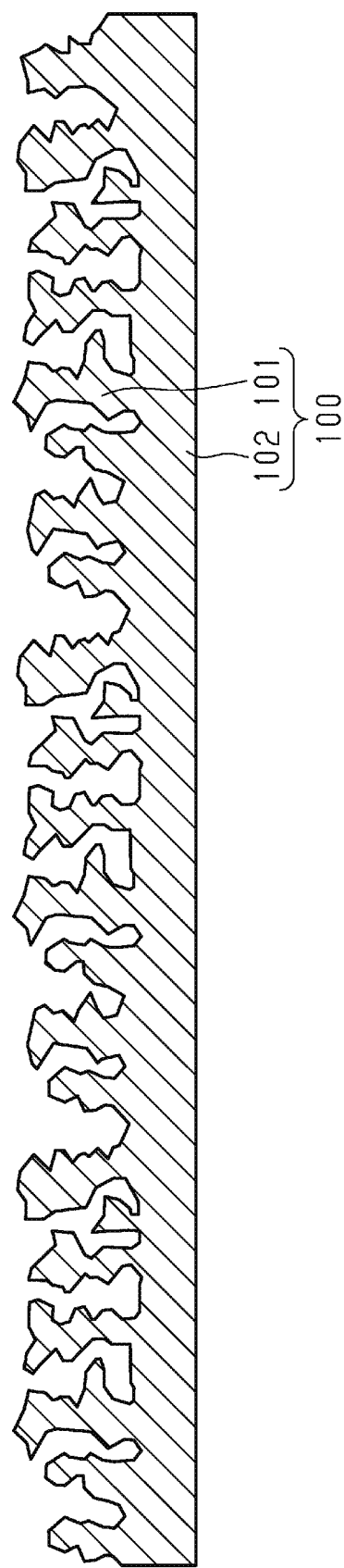

First, as illustrated in FIGS. 2A and 2B, a conductive metal substrate 100 is prepared. Material constituting the conductive metal substrate 100 includes aluminum, tantalum, nickel, copper, titanium, niobium and iron, an alloy such as stainless steel and duralumin, and the like, for example. Preferably, the material constituting the conductive metal substrate 100 is aluminum. The conductive metal substrate 100 is provided on its one principal face with a porous metal layer 101, and on its other principal face with a support layer 102. That is, the one surface of the conductive metal substrate 100 is formed of the porous metal layer 101, and the other surface of the conductive metal substrate 100, opposite to the one surface, is formed of the support layer 102.

The porous metal layer 101 has a porosity larger than a porosity of the support layer 102. In addition, the porous metal layer 101 has an enlargement ratio of area, larger than an enlargement ratio of area of the support layer 102. That is, the porous metal layer 101 has a specific surface area larger than that of the support layer 102.

Figure 3A:
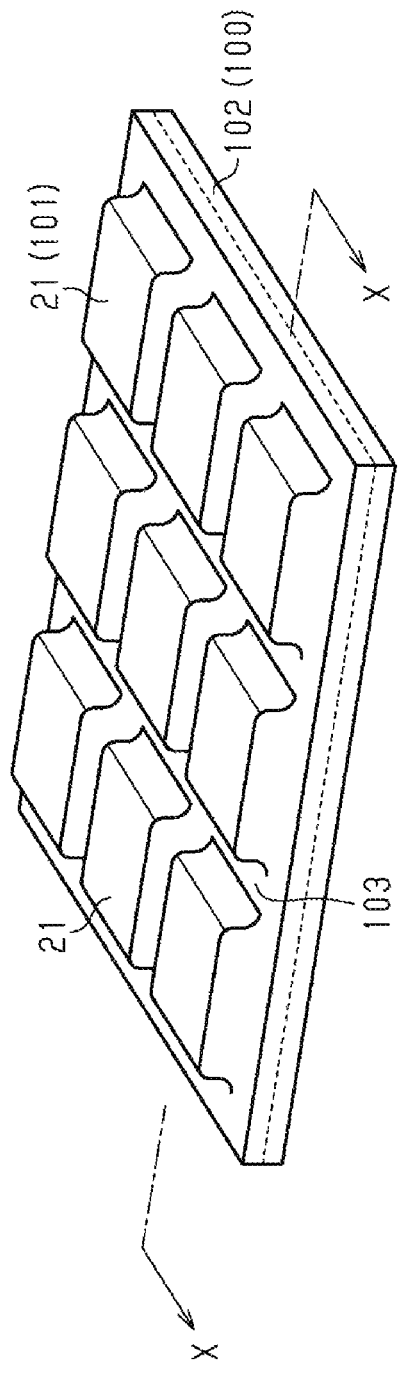
FIGS. 3A-3B are an illustration for describing a method for manufacturing a capacitor, FIG. 3A being a perspective view of a collective substrate, and FIG. 3B being a schematic sectional view taken along line X-X of FIG. 3A.
Figure 3B:
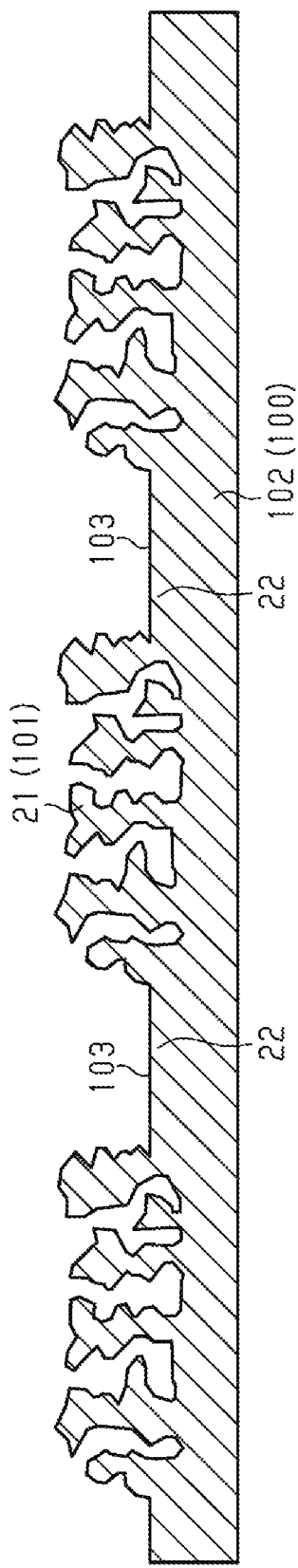

As illustrated in FIGS. 3A and 3B, grooves 103 are formed so as to squeeze holes in some regions of the porous metal layer 101. As a result, the porous metal layer is divided. The divided porous metal layers each correspond to the high porosity portion 21. The groove 103 is formed between the high porosity portions 21, and the bottom face of the groove 103 is formed by the low porosity portion 22 as a second porosity portion formed by squeezing the porous metal layer. As a method for forming the groove 103, a method for squeezing a hole can be used as described above, and there are available a method for squeezing a hole by compressing the hole using press work and a method for squeezing a hole by melting a corresponding portion with a laser or the like, for example. As another aspect, there is conceivable a method for forming the groove 103 by removing a part of the porous metal layer 101. In this case, the method is not particularly limited, but there is available a method for removing it with a dicer, a laser, or the like. Further, when the groove 103 is formed, there is conceivable a case where the porous metal layer 101 is completely removed using a laser. At this time, the bottom face of the groove 103 has a porosity of zero or almost zero. In this case, while the above-described low porosity portion 22 does not exist on the bottom face of the groove 103, the bottom face of the groove 103 corresponds to the second porosity portion, and thus the second porosity portion still exists.

As illustrated in FIGS. 4A and 4B, the insulating layer 30 is formed in the groove 103. The insulating layer 30 can be formed by filling the groove 103 with an insulating material (e.g., polyimide resin) or coating the bottom of the groove 103 with the insulating material using an air type dispenser, a jet dispenser, inkjet, screen printing, electrostatic coating method, or the like, for example. It is preferable to fill the insulating material up to the middle of the depth of the groove 103. Adjusting a filling volume in this manner enables the insulating material to be prevented from overflowing from the groove 103 even when the amount of coating varies.

Figure 5A:
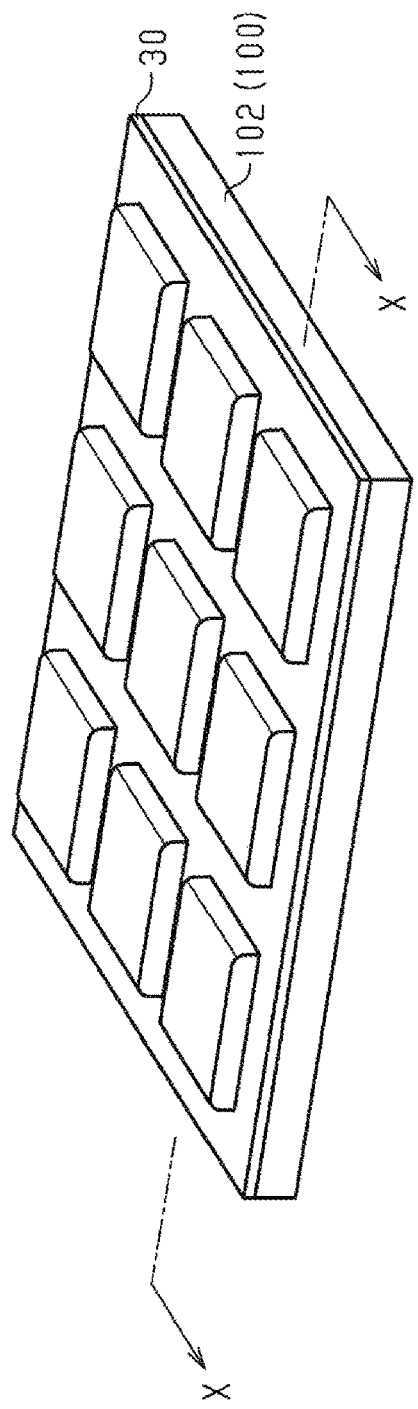
FIGS. 5A-5B are an illustration for describing a method for manufacturing a capacitor, FIG. 5A being a perspective view of a collective substrate, and FIG. 5B being a schematic sectional view taken along line X-X of FIG. 5A.
Figure 5B:
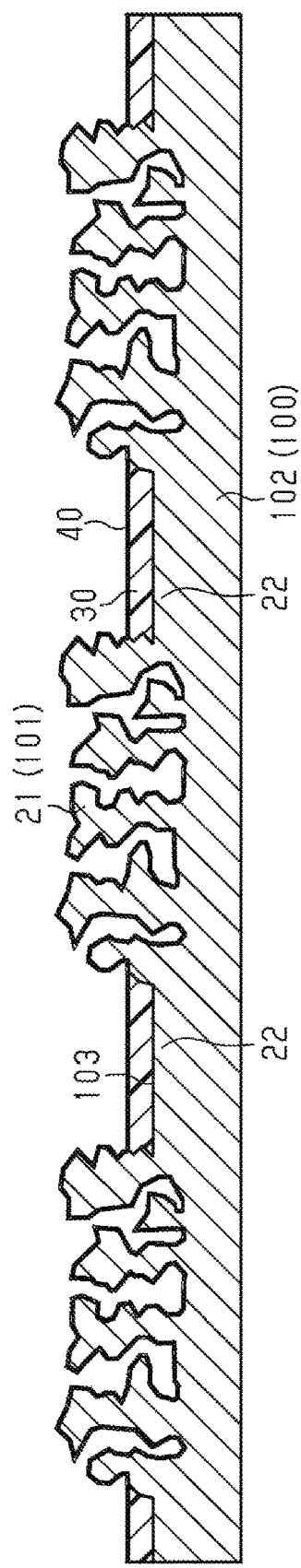

As illustrated in FIGS. 5A and 5B, the dielectric layer 40 is formed on the conductive metal substrate obtained in the above step, by the ALD method.

Figure 6A:
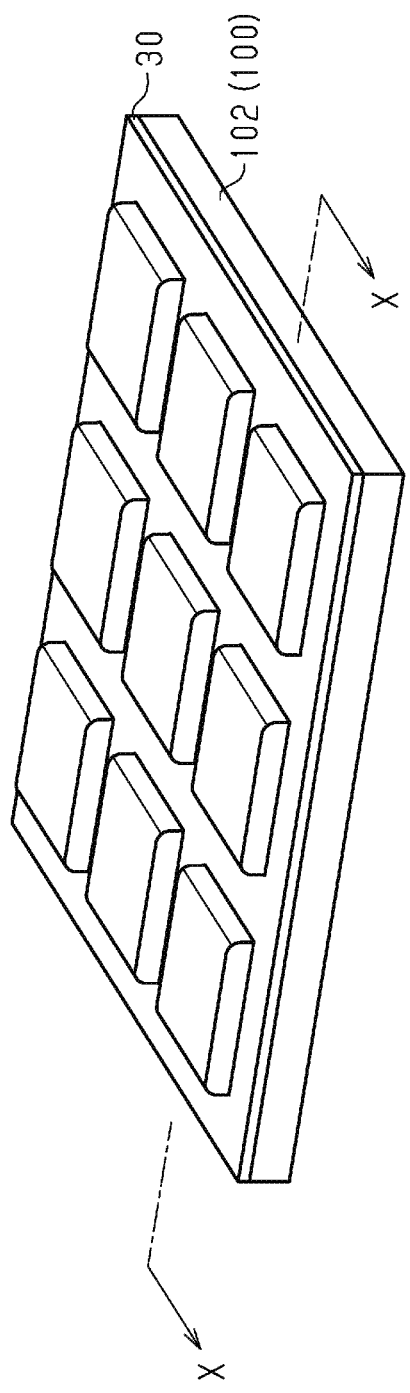
FIGS. 6A-6B are an illustration for describing a method for manufacturing a capacitor, FIG. 6A being a perspective view of a collective substrate, and FIG. 6B being a schematic sectional view taken along line X-X of FIG. 6A.
Figure 6B:
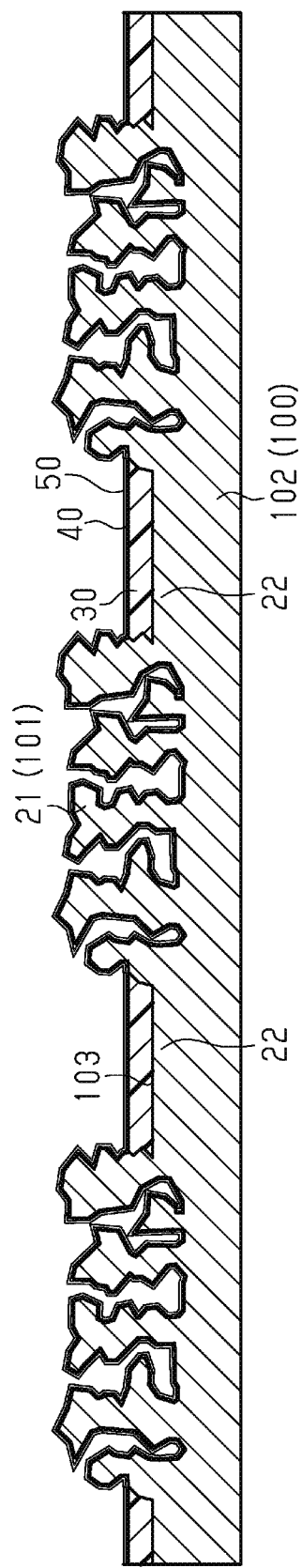

As illustrated in FIGS. 6A and 6B, the upper electrode 50 is formed on the dielectric layer 40 by the ALD method.

Figure 7A:
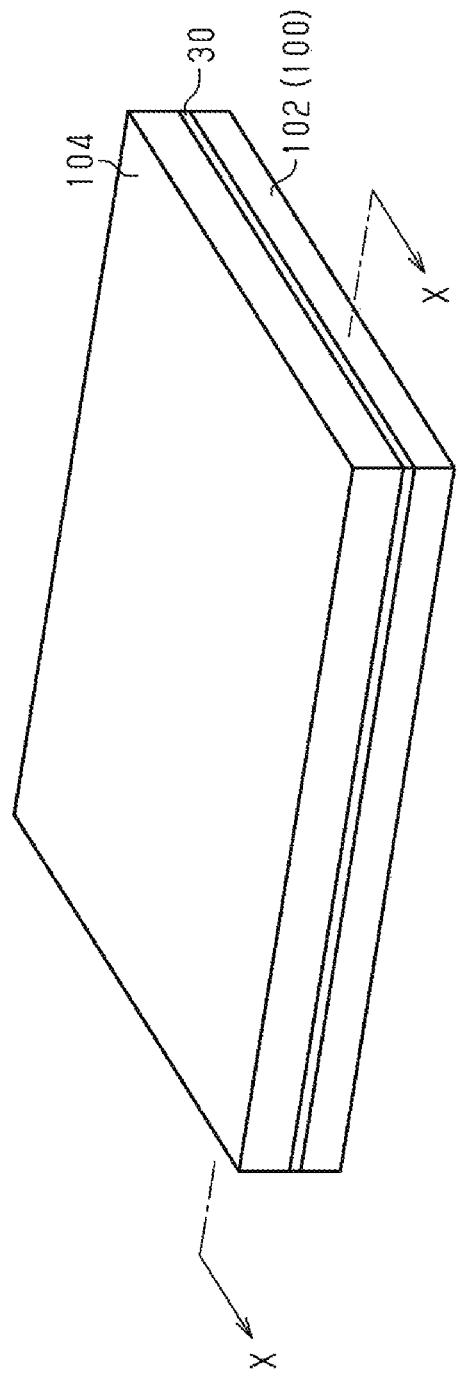
FIGS. 7A-7B are an illustration for describing a method for manufacturing a capacitor, FIG. 7A being a perspective view of a collective substrate, and FIG. 7B being a schematic sectional view taken along line X-X of FIG. 7A.
Figure 7B:
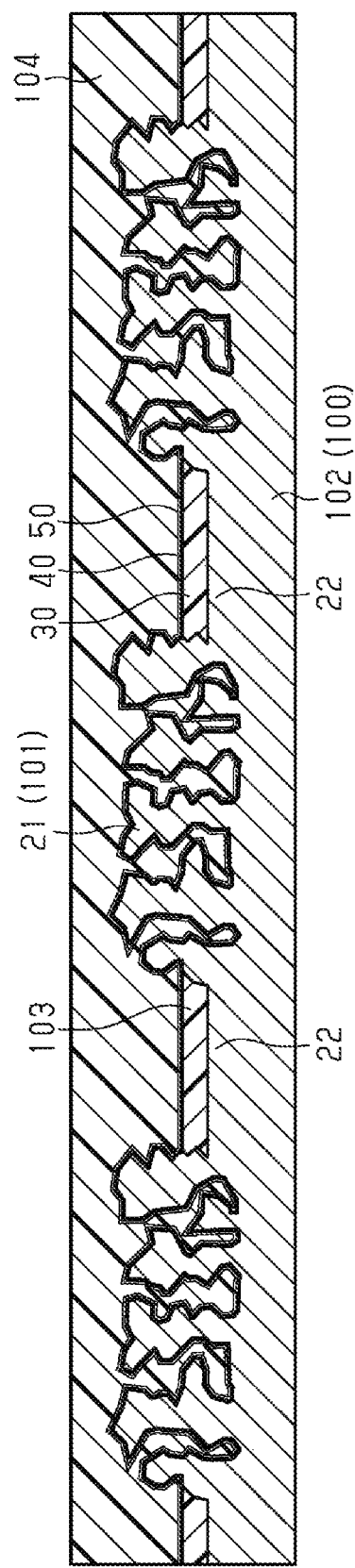

As illustrated in FIGS. 7A and 7B, an insulating portion 104 is formed on the upper electrode 50. For example, the insulating portion 104 is formed by a method including the steps of: disposing an epoxy resin sheet on the upper electrode 50; disposing a releasing film on an upper portion of the epoxy resin sheet; and performing press working under a pressure of 1 MPa at 200° C. for 120 minutes by sandwiching them between mirror-finished SUS plates.

Figure 8A:
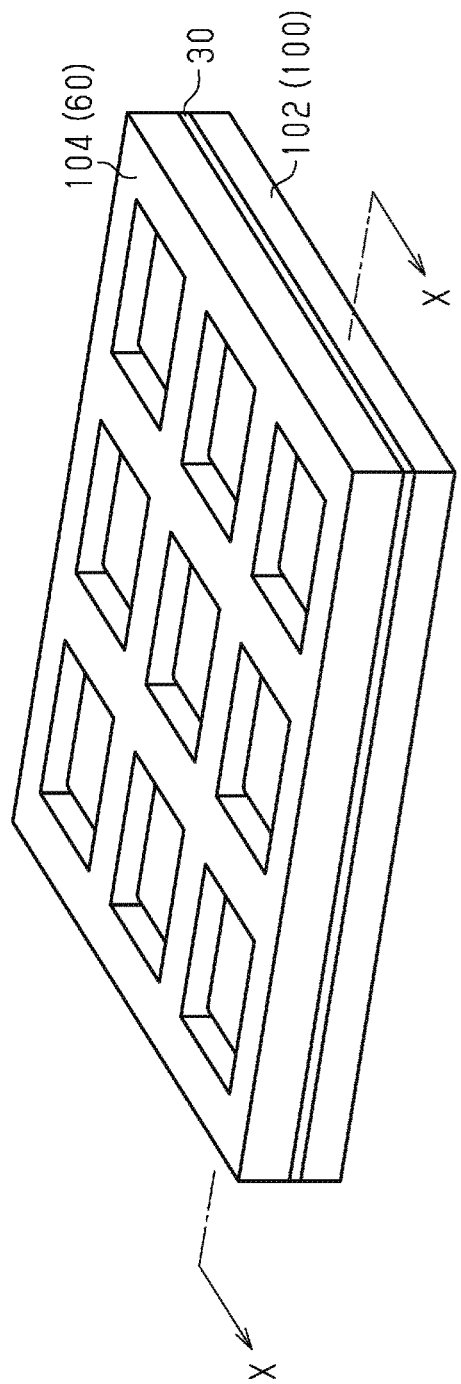
FIGS. 8A-8B are an illustration for describing a method for manufacturing a capacitor, FIG. 8A being a perspective view of a collective substrate, and FIG. 8B being a schematic sectional view taken along line X-X of FIG. 8A.
Figure 8B:
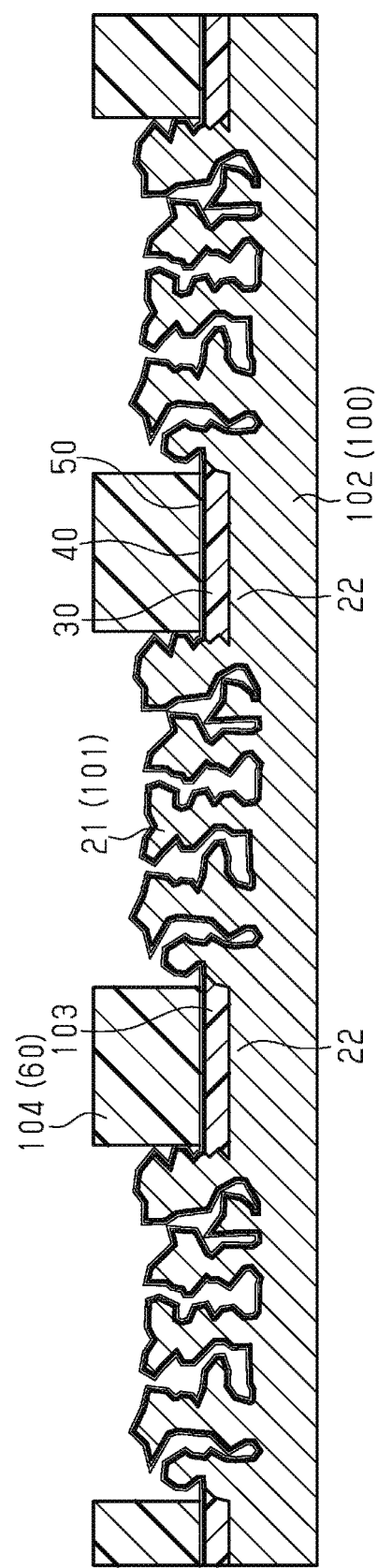

As illustrated in FIGS. 8A and 8B, a part of the insulating portion 104 (a portion where the upper extended electrode 71 is to be formed) is removed by laser processing. When a part of the insulating portion 104 is removed by using a laser, it is preferable to perform desmear for removing smears remaining in the corresponding portion.

The insulating portion 104 remaining after the laser processing corresponds to the insulating layer 60.

Figure 9A:
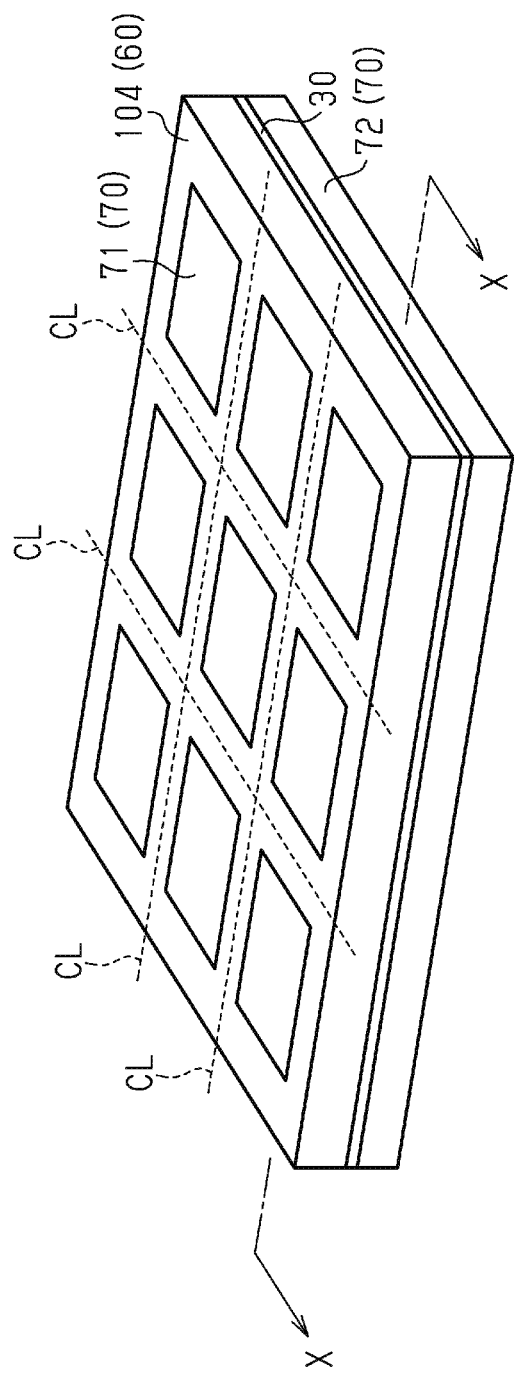
FIGS. 9A-9B are an illustration for describing a method for manufacturing a capacitor, FIG. 9A being a perspective view of a collective substrate, and FIG. 9B being a schematic sectional view taken along line X-X of FIG. 9A.
Figure 9B:
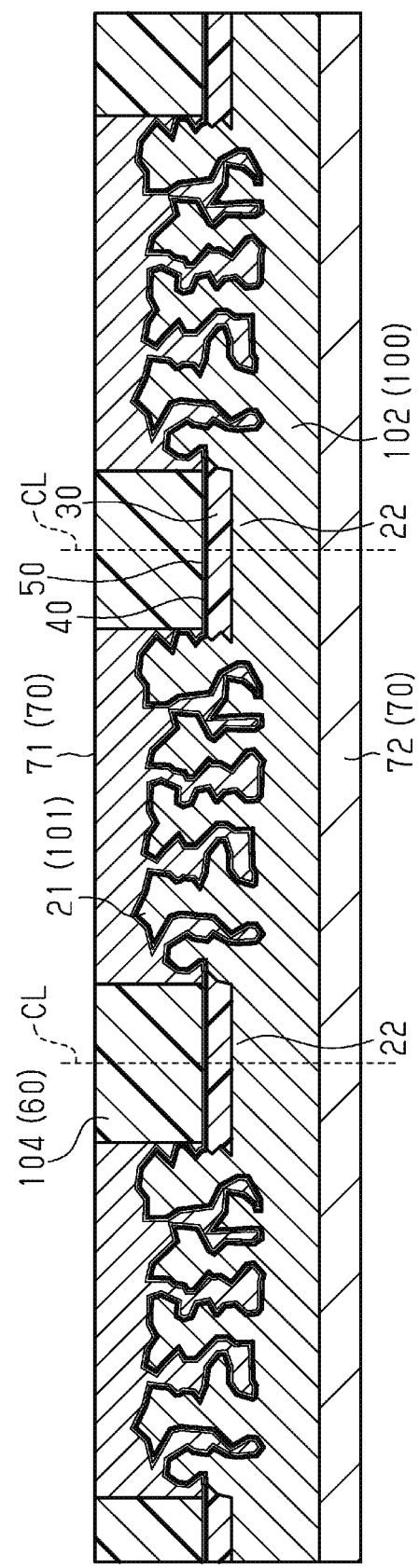

Subsequently, as illustrated in FIGS. 9A and 9B, the upper extended electrode 71 is formed so as to be flat with the insulating layer 60 (insulating portion 104) at the portion from which the insulating portion 104 is removed, and the lower extended electrode 72 is formed on a lower face. Each of the extended electrodes 71 and 72 can be formed by a method such as sputtering, vapor deposition, electrolytic plating, electroless plating, and the like. In addition, these methods can be used in combination with each other. For example, in the present example, a Cu-plating electrode is formed by electroless plating. The support layer 102 (aluminum) of the conductive metal substrate 100 is exposed to the lower extended electrode 72 on the lower face, so that it is preferable to apply zincate treatment and electroless Ni-plating as pretreatment. Further, in the case of forming a TiN film by the ALD method when the upper electrode 50 is formed, for example, upper and lower faces of the support layer 102 can be simultaneously formed. This allows the TiN film to be formed on the lower face of the support layer 102, so that pretreatment at the time of plating of the lower extended electrode 72 is unnecessary. While voids in the high porosity portion 21 (porous metal layer 101) are filled with the upper extended electrode 71 in FIG. 9B, a part or the whole of the voids may not filled with the upper extended electrode 71.

Then, cutting along lines CL shown in FIGS. 9A and 9B allows the capacitors 10 (refer to FIG. 1) to be obtained. While cutting method is not particularly limited, cutting with various laser apparatuses, dicers, presses, and the like, can be considered. More preferred is a nanosecond fiber laser.

The present inventors manufactured a capacitor with a size of 1.0 mm by 0.5 mm, a thickness of 55 μm, and a capacitance (measured at 1 kHz, and 0.1 Vrms) of about 100 nF by the manufacturing method described above.

A height difference between the insulating layer 60 and the upper extended electrode 71 was measured with a laser microscope in a state where the manufactured capacitor was placed on a flat surface. When a height difference between the insulating layer 60 and the upper extended electrode 71 was measured for five capacitors, a maximum difference of 1 μm was obtained, whereby it was found that a capacitor with a high smoothness (flatness) could be obtained. It is preferable that the height difference between the insulating layer 60 and the upper extended electrode 71 is 5 μm or less. When the height difference between the insulating layer 60 and the upper extended electrode 71 is 5 μm or less, reliability of bonding with a via favorably increases when a capacitor is incorporated in a circuit board.

According to the present embodiment described above, the following operational effects can be achieved.

(1) At least the insulating layer 60 is provided on a relatively low peripheral edge of the capacitor (on a low porosity portion 22 side), so that a recess in the peripheral edge of the capacitor can be eliminated. This enables improvement in flatness of the principal face.

(2) The insulating layer 60 is provided at a position overlapping with the low porosity portion 22 through the dielectric layer 40 and the upper electrode 50, while surrounding the periphery of the upper extended electrode 71 positioned on a central side of the capacitor 10. This forms a structure in which the upper extended electrode 71 is not exposed to a side face of the capacitor 10 (a side face facing in the direction orthogonal to the principal face), so that a short circuit between the upper extended electrode 71 and the lower extended electrode 72 can be prevented.

(3) The insulating layer 30 is provided at any position between the conductive metal substrate 20 and the upper electrode 50, so that a short circuit between the conductive metal substrate 20 and the upper electrode 50 can be prevented.

(4) The dielectric layer 40 is formed by an atomic layer deposition method (ALD method), so that the dielectric layer can be made uniform in thickness.

(5) The upper electrode 50 is formed by the atomic layer deposition method (ALD method), so that a layer (film) of the upper electrode can be made uniform in thickness.

(6) The dielectric layer 40 and the upper electrode 50 are continuously formed by the atomic layer deposition (ALD) method, and thus the ALD method can contribute to improvement in productivity.

Second Embodiment

A second embodiment will be described below with reference to FIG. 10. Differences from the first embodiment will be mainly described below, and a part or all of description of the same member will be eliminated by attaching the same reference numeral thereto.

Figure 10:
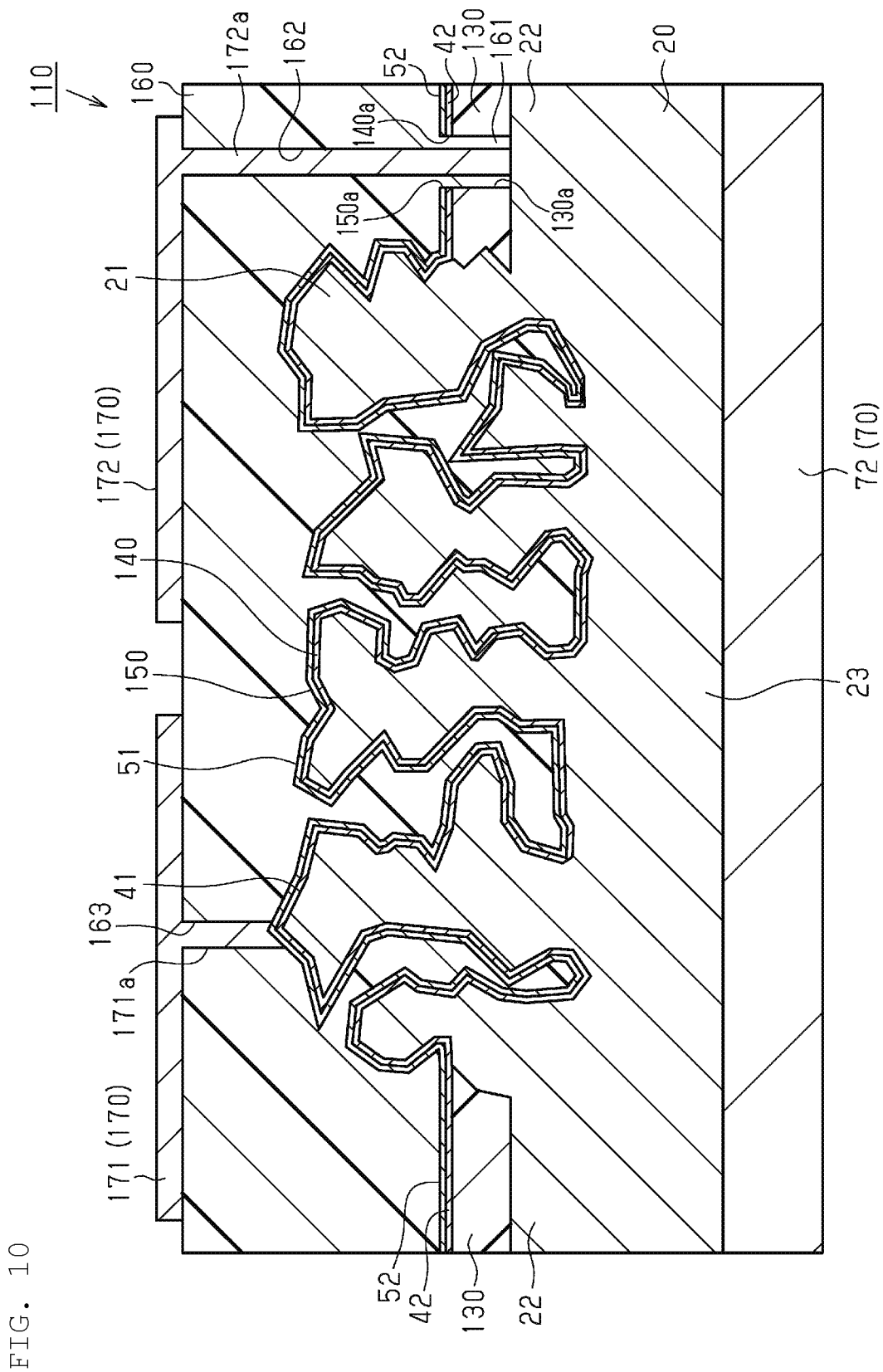
FIG. 10 is a sectional view of a capacitor in a second embodiment.

As illustrated in FIG. 10, a capacitor 110 includes a conductive metal substrate 20, an insulating layer 130, a dielectric layer 140, an upper electrode 150, an insulating layer 160, and an extended electrode 170.

The insulating layer 130 corresponds to the insulating layer 30 of the first embodiment. The insulating layer 130 is different from the insulating layer 30 in that a through hole 130a is formed.

The dielectric layer 140 corresponds to the dielectric layer 40 of the first embodiment. The dielectric layer 140 is different from the dielectric layer 40 in that a through hole 140a is formed. The through hole 140a is formed at the same position as that of the through hole 130a.

The upper electrode 150 corresponds to the upper electrode 50 of the first embodiment. The upper electrode 150 is different from the upper electrode 50 in that a through hole 150a is formed. The through hole 150a is formed at the same position as that of each of the through hole 140a and the through hole 130a.

The insulating layer 160 corresponds to the insulating layer 60 of the first embodiment. The insulating layer 160 is formed on the upper electrode 150 so as to cover the entire upper electrode 150. That is, the insulating layer 160 is formed on a first upper electrode 51 and a second upper electrode 52 constituting the upper electrode 150. In addition, the insulating layer 160 has a substantially plate-like shape, and includes a protruding portion 161 formed so as to protrude from one of surfaces of the insulating layer 160, the protruding portion 161 passing through the through holes 130a, 140a, and 150a to come into contact with a low porosity portion 22 (the conductive metal substrate 20). The protruding portion 161 is provided with a through hole 162. The through hole 162 is formed so as to pass through the insulating layer 160 in the thickness direction of the insulating layer 160, or from one principal face of the capacitor 110 to the other principal face thereof. The insulating layer 160 is provided with a through hole 163. The through hole 163 is formed so as to pass through the insulating layer 160 in the thickness direction of the insulating layer 160, or from one principal face of the capacitor 110 to the other principal face thereof.

The extended electrode 170 includes a first upper extended electrode 171 provided in an upper portion, a second upper extended electrode 172 provided in the upper portion while being electrically insulated from the first upper extended electrode 171, and a lower extended electrode 72. That is, in the present embodiment, the capacitor 110 is provided on its one principal face with the first upper extended electrode 171 as a first terminal electrode and the second upper extended electrode 172 as a third terminal electrode. Then, the capacitor 110 is provided on its other principal face with the lower extended electrode 72 as a second terminal electrode.

The first upper extended electrode 171 corresponds to the upper extended electrode 71 of the first embodiment.

The first upper extended electrode 171 is configured such that its protruding piece 171a passes through the through hole 163 to come into contact with the upper electrode 150. This allows the first upper extended electrode 171 to be electrically connected to the upper electrode 150.

The second upper extended electrode 172 is configured such that its protruding piece 172a passes through the through hole 162 to come into contact with the conductive metal substrate 20. This allows the second upper extended electrode 172 to be electrically connected to the conductive metal substrate 20.

Subsequently, a process for manufacturing (a method for manufacturing) the capacitor 110 configured as described above will be described. The method for manufacturing the capacitor 110 is described while a part or all of description for a similar portion is eliminated.

After the upper electrode 150 is formed on the dielectric layer 140, the through holes 130a, 140a, 150a are formed by laser processing, for example.

Subsequently, the insulating layer 160 is formed on the upper electrode 50. For example, the insulating layer 160 is formed by a method including the steps of: disposing an epoxy resin sheet on the upper electrode 150; disposing a releasing film on an upper portion of the epoxy resin sheet; and performing press working under a pressure of 1 MPa at 200° C. for 120 minutes by sandwiching them between mirror-finished SUS plates. At this time, the epoxy resin enters the through holes 130a, 140a, and 150a to form the protrusion 161.

Subsequently, the through hole 162 and the through hole 163 are formed in the insulating layer 160 by laser processing, for example. The through hole 162 is formed such that the insulating layer 160 is removed until reaching the low porosity portion 22 (conductive metal substrate 20). The through hole 163 is formed such that the insulating layer 160 is removed until reaching the upper electrode 150. When a part of the insulating layer 160 is removed by using a laser, it is preferable to perform desmear for removing smears remaining in the corresponding portion.

Subsequently, the extended electrode 170 is formed while the protruding pieces 171a and 172a of the corresponding upper extended electrodes 171 and 172 are respectively interposed in the through holes 162 and 163 formed by removing a part of the insulating layer 160. At this time, the protruding piece 171a is formed so as to come into contact with the upper electrode 150, and the protruding piece 172a is formed so as to come into contact with the low porosity portion 22 (the conductive metal substrate 20).

According to the present embodiment described above, the following effect can be achieved in addition to the effects (1), (3), (4), (5), and (6) of the first embodiment.

(7) The capacitor 110 is provided on its one principal face with the first upper extended electrode 171 and the second upper extended electrode 172, and is provided on its other principal face with the lower extended electrode 72. In other words, placement of the terminal electrodes on the substrate allows a case where the first upper extended electrode 171 and the lower extended electrode 72 are used, and a case where the first upper extended electrode 171 and the second upper extended electrode 172 are used, to be properly selected, and thus can contribute to improvement in convenience.

(Modification)

Each of the above-described embodiments also can be implemented in the following modes in which they are appropriately modified.

While the first embodiment has a structure in which the insulating layer 30 is applied after the groove 103 is formed, or the insulating layer 30 is laminated on the groove 103, the structure is not limited to this. For example, the insulating layer 30 may be formed after the dielectric layer 40 is formed. That is, the insulating layer 30 needs to be formed between the conductive metal substrate 20 and the upper electrode 50.

The capacitor 110 of the second embodiment also may have the insulating layer 130 that is formed after the dielectric layer 140 is formed.

While the first embodiment includes the insulating layer 30 as the second insulating layer, besides this, a structure without the insulating layer 30 may be used.

Likewise, the second embodiment also may use a structure without the insulating layer 130.

While there is no specific description in the first embodiment, a part of the insulating layer 60 as the first insulating layer may be disposed at a position overlapping with the high porosity portion 21 as the first porosity portion through the dielectric layer 40 and the upper electrode 50, for example. In addition, the insulating layer 60 may be disposed at a position without overlapping with the high porosity portion 21 as the first porosity portion, as illustrated in FIG. 1.

While the second embodiment has a structure in which the lower extended electrode 72 as the second terminal electrode is exposed, the structure is not limited to this.

Figure 11:
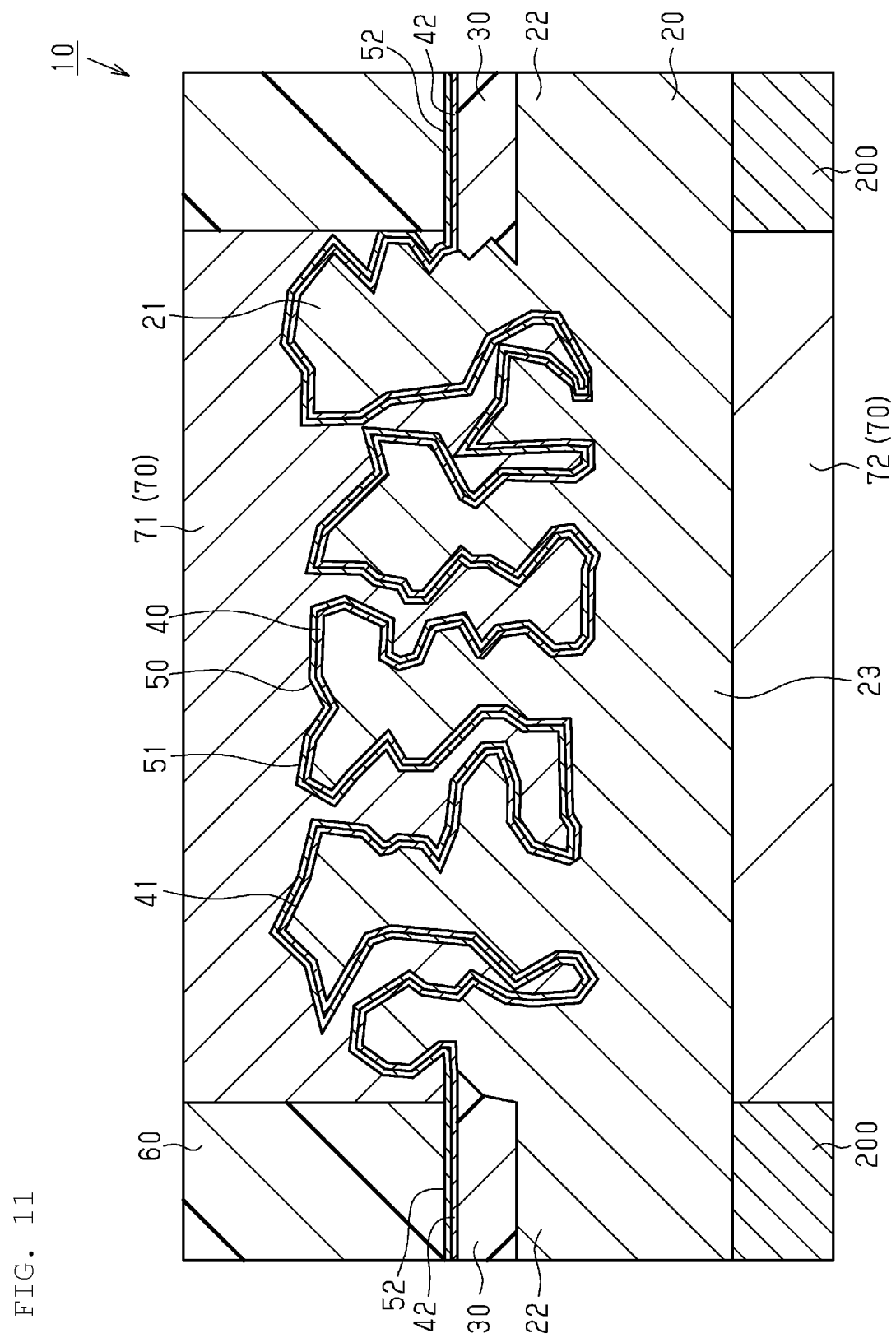
FIG. 11 is a sectional view of a capacitor in a modification.

As illustrated in FIG. 11, a structure in which the periphery of the lower extended electrode 72 is surrounded by an insulating layer 200 as the third insulating layer may be used. The structure as described above allows the lower extended electrode 72 as the second terminal electrode not to be exposed to the side face (the side face facing in the direction perpendicular to the principal face) of the capacitor 10, so that a short circuit between the upper extended electrode 71 and the lower extended electrode 72 can be prevented.

Further, an insulating layer provided on a lower extended electrode 72 side is not limited to the structure as illustrated in FIG. 11. For example, a structure in which a plurality of insulating layers are interposed so as to partition the lower extended electrode 72 in the width direction of the capacitor 10 (the left and right direction in FIG. 11) may be used. That is, the insulating layer may be interposed at a position other than where the lower extended electrode 72 is to be extended.

Figure 12:
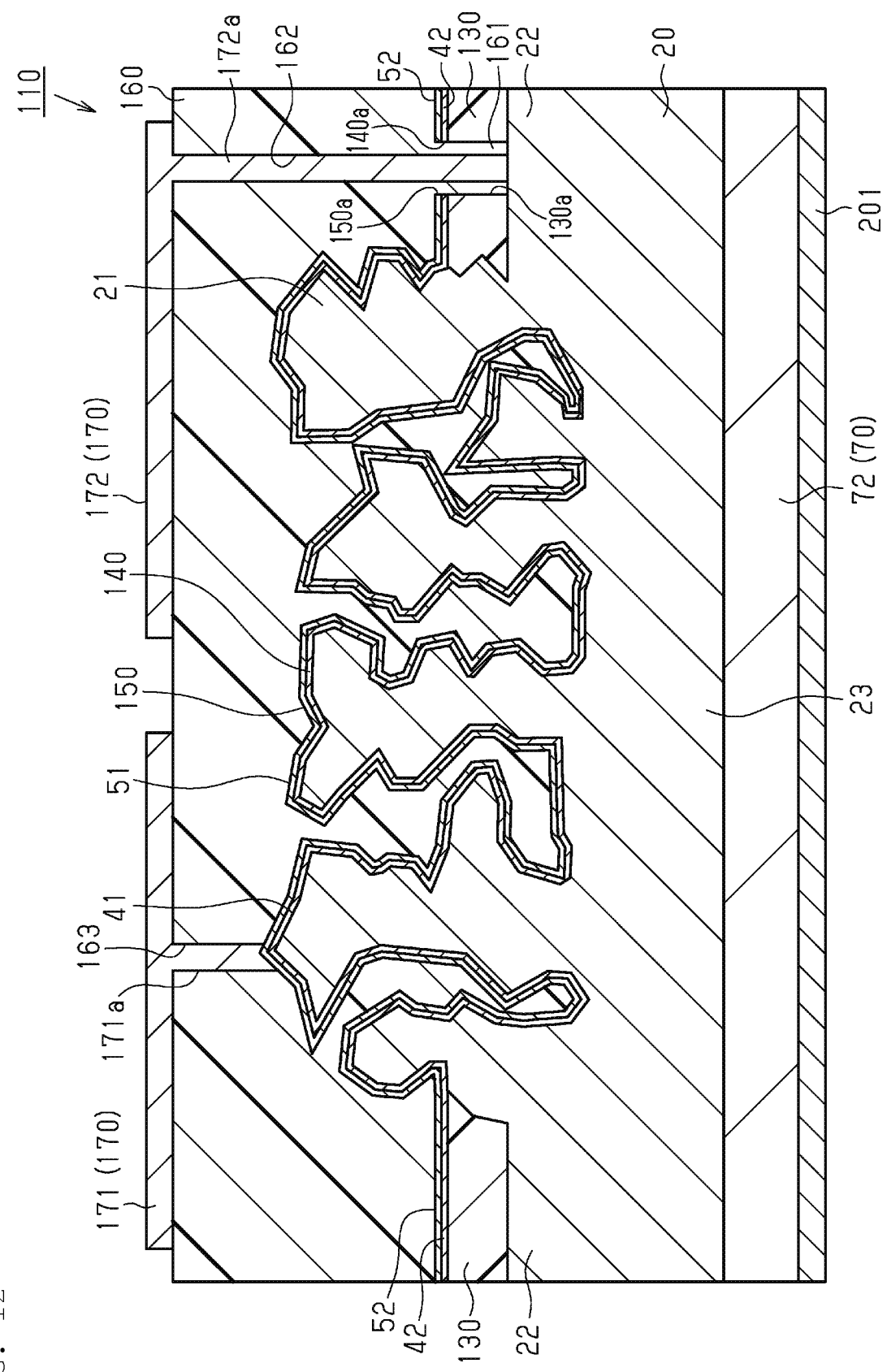
FIG. 12 is a sectional view of a capacitor in a modification.

As illustrated in FIG. 12, there may be used a structure in which the conductive metal substrate 20 is provided on its other principal face with an insulating layer 201 as the fourth insulating layer with which the surface of the lower extended electrode 72 as the second terminal electrode is covered. The structure as described above enables capacitance between the first upper extended electrode 171 as the first terminal electrode and the second upper extended electrode 172 as the third terminal electrode to be obtained. In addition, when the insulating layer 201 is preliminarily formed, the insulating layer 201 enables insulation even if a circuit pattern is formed on a substrate on which the capacitor 110 is mounted.

Figure 13:
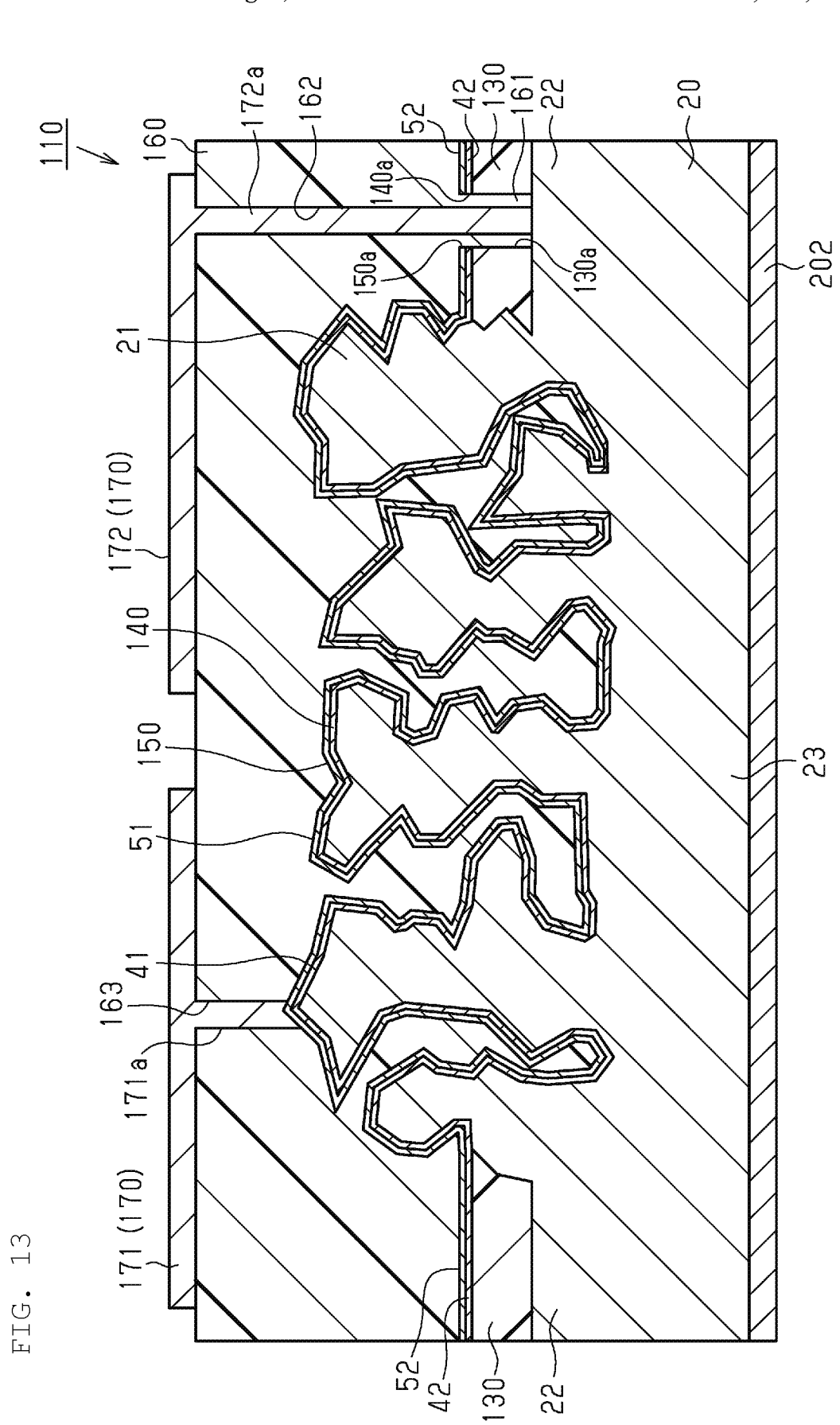
FIG. 13 is a sectional view of a capacitor in a modification.

While the second embodiment has a structure in which the lower extended electrode 72 as the second terminal electrode is provided, the structure is not limited to this. For example, a structure without the lower extended electrode 72 may be used. That is, as illustrated in FIG. 13, the first upper extended electrode 171 as the first terminal electrode and the second upper extended electrode 172 as the second terminal electrode are provided on the one principal face of the conductive metal substrate 20. In this case, the first upper extended electrode 171 corresponds to the first upper terminal electrode, and the second upper extended electrode 172 corresponds to the second upper terminal electrode. In addition, as illustrated in FIG. 13, it is preferable to provide an insulating layer 202 so as to cover the support portion 23, instead of the lower extended electrode 72 eliminated.

In each of the above embodiments, while the capacitors 10 and 110 each have a substantially rectangular parallelepiped shape, the shape is not limited to this. As a shape of the capacitor in plan view, a circular shape, an elliptical shape, or the like may be used.

Each of the above embodiments and each of the modifications may be combined as appropriate.

What is claimed is:

1. A capacitor comprising:
    a conductive metal substrate having a first porosity portion and a second porosity portion with a porosity lower than that of the first porosity portion, the first porosity portion protruding from the second porosity portion, and the first porosity portion and the second porosity portion defining a first principal face of the conductive metal substrate;
    a dielectric layer on the first principal face of the conductive metal substrate;
    an upper electrode directly on the dielectric layer;
    a first terminal electrode electrically connected to the upper electrode;
    a second terminal electrode on a second principal face of the conductive metal substrate opposite to the first principal face and electrically connected to the conductive metal substrate;
    a first insulating layer on the upper electrode and at a position overlapping with the second porosity portion such that the dielectric layer and the upper electrode are positioned between the insulating layer and the second porosity portion; and
    a second insulating layer on the first principal face and at a position overlapping with the second porosity portion and the first insulating layer such that the dielectric layer and the upper electrode are positioned between the first insulating layer and the second insulating layer.

2. The capacitor according to claim 1, wherein the first terminal electrode is on the upper electrode at a position overlapping with the first porosity portion through the dielectric layer and the upper electrode, and
    the at least the first insulating layer surrounds a periphery of the first terminal electrode.

3. The capacitor according to claim 1, further comprising a third terminal electrode on the first principal face of the conductive metal substrate, insulated from the first terminal electrode, and electrically connected to the conductive metal substrate.

4. The capacitor according to claim 1, further comprising a third insulating layer surrounding a periphery of the second terminal electrode.

5. The capacitor according to claim 1, further comprising a third insulating layer covering a surface of the second terminal electrode.

6. A capacitor comprising:
    a conductive metal substrate having a first porosity portion and a second porosity portion with a porosity lower than that of the first porosity portion, the first porosity portion protruding from the second porosity portion, and the first porosity portion and the second porosity portion defining a first principal face of the conductive metal substrate;
    a dielectric layer on the first principal face of the conductive metal substrate;
    an upper electrode directly on the dielectric layer;
    a first upper terminal electrode electrically connected to the upper electrode;
    a second upper terminal electrode on the first principal face of the conductive metal substrate, electrically connected to the conductive metal substrate, and insulated from the first upper terminal electrode;
a first insulating layer on the upper electrode and at a position overlapping with the second porosity portion such that the dielectric layer and the upper electrode are positioned between the insulating layer and the second porosity portion; and
a second insulating layer on the first principal face and at a position overlapping with the second porosity portion and the first insulating layer such that the dielectric layer and the upper electrode are positioned between the first insulating layer and the second insulating layer.

7. The capacitor according to claim 6, wherein the first terminal electrode is on the upper electrode and overlaps with the first porosity portion through the dielectric layer and the upper electrode.

8. A method for manufacturing a capacitor, the method comprising:
   forming a dielectric layer on a conductive metal substrate, the conductive metal substrate having a first porosity portion and a second porosity portion with a porosity lower than that of the first porosity portion, the first porosity portion and the second porosity portion defining a first principal face of the conductive metal substrate;
   forming an upper electrode directly on the dielectric layer;
   forming a first insulating layer on the upper electrode at a position overlapping with the second porosity portion such that the dielectric layer and the upper electrode are positioned between the insulating layer and the second porosity portion;
   forming a second insulating layer on the first principal face and at a position overlapping with the second porosity portion and the first insulating layer such that the dielectric layer and the upper electrode are positioned between the first insulating layer and the second insulating layer;
   forming a first terminal electrode that is electrically connected to the upper electrode; and
   forming a second terminal electrode that is electrically connected to the conductive metal substrate.

9. The method for manufacturing a capacitor according to claim 8, wherein the dielectric layer is formed by an atomic layer deposition method.

10. The method for manufacturing a capacitor according to claim 8, wherein the upper electrode is formed by an atomic layer deposition method.

11. A method for manufacturing a capacitor, the method comprising:
   forming a dielectric layer on a conductive metal substrate, the conductive metal substrate having a first porosity portion and a second porosity portion with a porosity lower than that of the first porosity portion, the first porosity portion and the second porosity portion defining a first principal face of the conductive metal substrate;
   forming an upper electrode directly on the dielectric layer;
   forming a first insulating layer on the upper electrode at a position overlapping with the second porosity portion such that the dielectric layer and the upper electrode are positioned between the insulating layer and the second porosity portion;
   forming a second insulating layer on the first principal face and at a position overlapping with the second porosity portion and the first insulating layer such that the dielectric layer and the upper electrode are positioned between the first insulating layer and the second insulating layer;
   forming a first upper terminal electrode that is electrically connected to the upper electrode; and
   forming a second upper terminal electrode on the first principal face of the conductive metal substrate and that is electrically connected to the conductive metal substrate and insulated from the first upper terminal electrode.

12. The method for manufacturing a capacitor according to claim 11, wherein the dielectric layer is formed by an atomic layer deposition method.

13. The method for manufacturing a capacitor according to claim 11, wherein the upper electrode is formed by an atomic layer deposition method.

* * * * *